United States Patent [19]

Swanson et al.

[11] Patent Number: 5,218,471
[45] Date of Patent: * Jun. 8, 1993

[54] HIGH-EFFICIENCY, MULTILEVEL, DIFFRACTIVE OPTICAL ELEMENTS

[75] Inventors: Gary J. Swanson; Wilfrid B. Veldkamp, both of Lexington, Mass.

[73] Assignee: Massachusetts Institute of Technology, Cambridge, Mass.

[ * ] Notice: The portion of the term of this patent subsequent to Jan. 23, 2007 has been disclaimed.

[21] Appl. No.: 801,034

[22] Filed: Dec. 2, 1991

Related U.S. Application Data

[60] Continuation of Ser. No. 399,848, Aug. 29, 1989, Pat. No. 5,161,059, which is a division of Ser. No. 99,307, Sep. 21, 1987, Pat. No. 4,895,790.

[51] Int. Cl.$^5$ .................. G02B 27/44; G02B 3/08; G03C 5/00
[52] U.S. Cl. .................. 359/565; 359/569; 359/742; 430/321; 430/323; 430/324
[58] Field of Search .............. 430/321, 323, 329, 394, 430/322, 324; 359/558, 566, 569, 571, 619, 625, 742, 565

[56] References Cited

U.S. PATENT DOCUMENTS

| | | | |
|---|---|---|---|
| 3,726,732 | 4/1973 | Richardson et al. | 430/323 |
| 4,252,891 | 2/1981 | Kostyshin et al. | 430/323 |
| 4,327,171 | 4/1982 | Poler | 430/323 |
| 4,414,059 | 11/1983 | Blum et al. | 430/323 |
| 4,434,224 | 2/1984 | Yoshikawa et al. | 430/323 |
| 4,564,584 | 1/1986 | Fredericks et al. | 430/323 |
| 4,579,812 | 4/1986 | Bower | 430/323 |
| 4,632,898 | 12/1986 | Fister et al. | 430/323 |
| 4,690,880 | 9/1987 | Suzuki et al. | 430/323 |
| 4,724,043 | 2/1987 | Bergendahl | 430/323 |
| 4,895,790 | 1/1990 | Swanson et al. | 359/570 |

FOREIGN PATENT DOCUMENTS 0209123 12/1983 Japan ..................... 430/323
2129157 5/1984 United Kingdom .

OTHER PUBLICATIONS

Sonek et al., "Ultraviolet Grating Polarizers", *J. Vac. Sci. Technol.*, vol. 19, No. 4, Nov./Dec. 1981, pp. 921-923.
d'Auria et al., *Optics Comm.*, vol. 5, No. 4, Jul. 1972, pp. 232-235.
Vannucci, *Applied Optics*, vol. 25, No. 10, Aug. 15, 1986, pp. 2831-2834, "A 'tuned' Frexnel Lens".
Mikhaltsova et al., "Kinoform Axicons," *Optik*, vol. 67, No. 3, 1984, pp. 267-277.
Koronkevich et al., "Fabrication of Kinoform Optical Elements," *Optik*, vol. 67, No. 3, 1984, pp. 257-265.
Miyamoto, "The Phase Fresnel Lens," *Journal of the Optical Society of America*, vol. 51, No. 1, Jan. 1961, pp. 17-20.
Lesem et al., "The Kinoform: A New Wavefront Reconstruction Device," *IBM J. Res. Develop.*, Mar. 1969, pp. 150-155.
Goodman et al., "Some Effects of Fourier-domain Phase Quantization," *IBM J. Res. Develop.*, Sep. 1970, pp. 478-484.
Burggraaf, "Excimer Laser Lithography," *Semiconductor International*, May 1987, pp. 49-50.

Primary Examiner—Bruce Y. Arnold
Assistant Examiner—David Parsons
Attorney, Agent, or Firm—Choate, Hall & Stewart

[57] ABSTRACT

The method utilizes high resolution lithography, mask aligning, and reactive ion etching. In particular, at least two binary amplitude masks are generated. A photoresist layer on an optical element substrate is exposed through the first mask and then etched. The process is then repeated for the second and subsequent masks to create a multistep configuration. The resulting optical element is highly efficient.

11 Claims, 8 Drawing Sheets

RADIAL DISTRIBUTION

HIGH-EFFICIENCY, MULTILEVEL, DIFFRACTIVE OPTICAL ELEMENTS

This is a continuation of copending application Ser. No. 07/399,848, filed on Aug. 29, 1989, and issued on Oct. 20, 1992 as U.S. Pat. No. 5,161,059, which is a divisional of Ser. No. 07/099,307, filed Sep. 21, 1987, and issued on Jan. 23, 1990 as U.S. Pat. No. 4,895,790.

BACKGROUND OF THE INVENTION

This invention relates to high-efficiency, on-axis, multilevel, diffractive optical elements. The high efficiency of these elements allows planar or spherical elements to be diffractively converted to generalized aspheres, and dispersive materials can be diffractively compensated to behave as achromatic materials over broad wavebands. The technique of this disclosure allows ready implementation of this mixed reflective, refractive and diffractive optics in real systems.

The ability to produce arbitrary phase profiles allows for an additional degree of freedom in designing optical systems. Many optical systems now incorporate aspheric refractive surfaces to produce such phase profiles. System design is restricted by constraints imposed by factors such as cost, size, and allowable asphericity. Diffractive elements are potentially as versatile and useful as aspheric surfaces and are less expensive, and not as subject to asphericity constraints. Another objective in designing optical systems is to minimize chromatic aberrations. Refractive optical materials are chromatically dispersive. Conventionally, the approach to minimizing chromatic aberrations is to balance the dispersive effects of two different refractive materials. Diffractive surfaces are also wavelength dispersive. It is therefore possible to take a dispersive refractive element, and by placing a diffractive profile on one of its surfaces, produce an element that balances the chromatic effects of the refractive element against the chromatic effects of the diffractive surface. Computer generated diffractive elements have been proposed for numerous applications such as chromatic correction, aberration compensated scanners, and high numerical aperture lenses. A major obstacle to implementing on-axis diffractive elements in actual systems is the, up to now, low diffusion efficiency ($<50\%$).

Theoretically, on-axis diffractive phase elements can achieve 100% diffraction efficiency. To achieve this efficiency, however, a continuous phase profile is necessary. (See, Miyamoto, K., 1961, JOSA 51, 17 and Lesem, L., Hirsch, P., Jordan, J., 1969, IBM J. Res. Dev. 13, 150.) The technology for producing high-quality, high-efficiency, continuous phase profiles does not exist. It has been suggested to quantize the continuous phase profile into discrete phase levels as an approximation to the continuous phase profile. (Goodman, J., Silvestri, A., 1970, IBM J. Res. Dev. 14, 478.) It is known to make such structures using thin-film deposition techniques and material cutting technology. (See, U.K. Patent Application No. 8327520 entitled "Bifocal Contact Lenses Having Diffractive Power".) L. d'Auria et al. in "Photolithographic Fabrication of Thin Film Lenses", OPTICS COMMUNICATIONS, Volume 5, Number 4, July, 1972 discloses a multilevel structure involving successive maskings and etchings of a silicon dioxide layer. Each mask gives only one additional level in the structure and is therefore inefficient. The invention disclosed herein is a method for accurately and reliably making multilevel diffractive surfaces with diffraction efficiencies that can be as high as 99%.

SUMMARY OF THE INVENTION

The method for making high-efficiency, multilevel, diffractive, optical elements according to the invention comprises generating a plurality of binary amplitude masks which include the multilevel phase information. The masks are configured to provide $2^N$ levels where N is the number of masks. The information in each mask is utilized serially for serial etching of the multilevel structures into the optical element. The masks may be made by electron beam lithography and it is preferred that the etching be accomplished by a dry etching technique such as reactive ion etching or ion bombardment. In general, the etching process includes coating the optical element substrate with a photoresist, exposing the photoresist through the masks, developing the photoresist, and etching the substrate. In order to achieve greater than 95% efficiency, three masks and three etching steps are used to produce eight phase levels. An important use of the structures of the invention is in UV lithography.

DESCRIPTION OF THE PREFERRED EMBODIMENT

Figure 1:
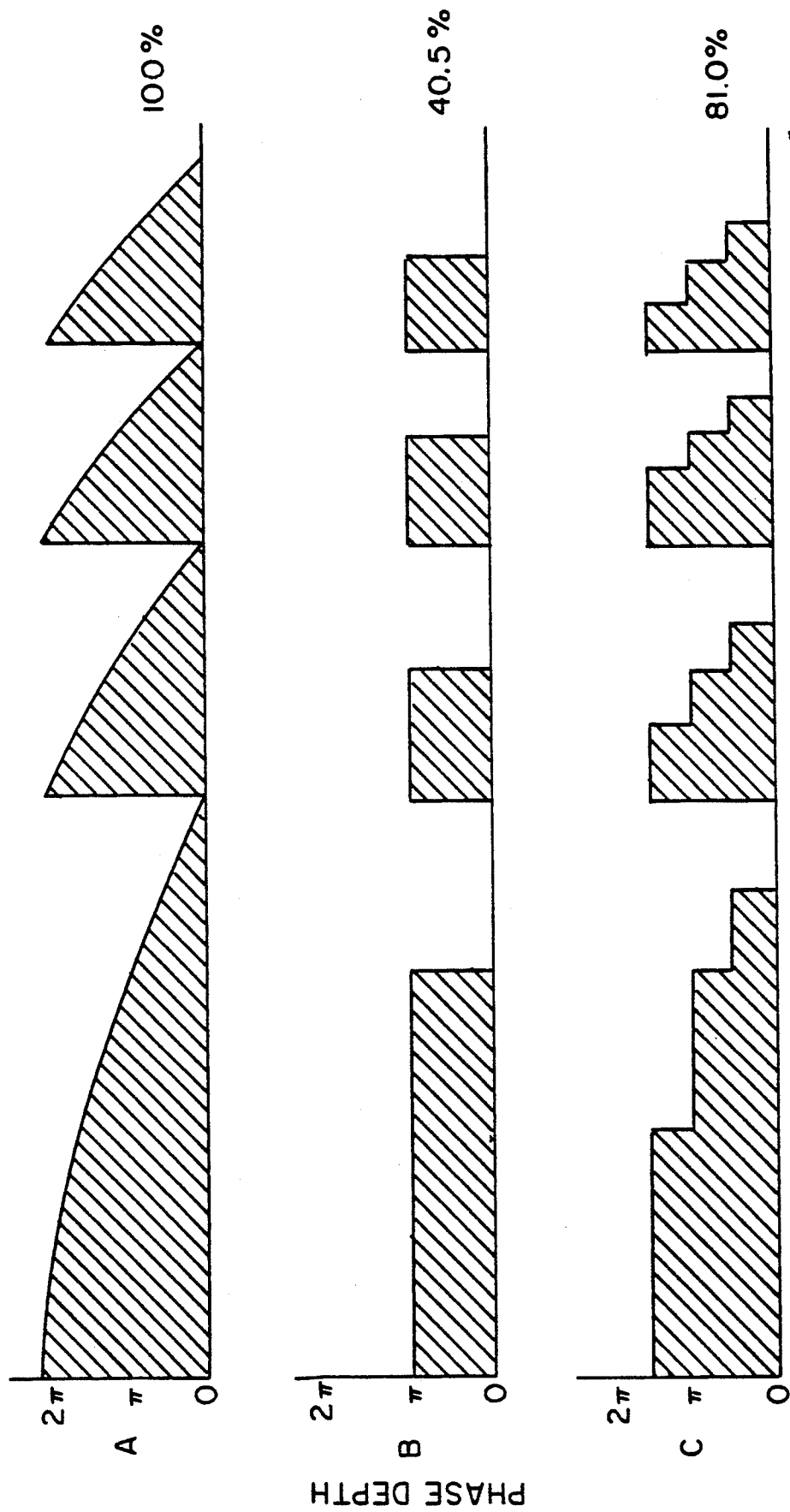
FIGS. 1a, 1b and 1c are schematic illustrations of Fresnel phase zone plate profiles.
Figure 2:
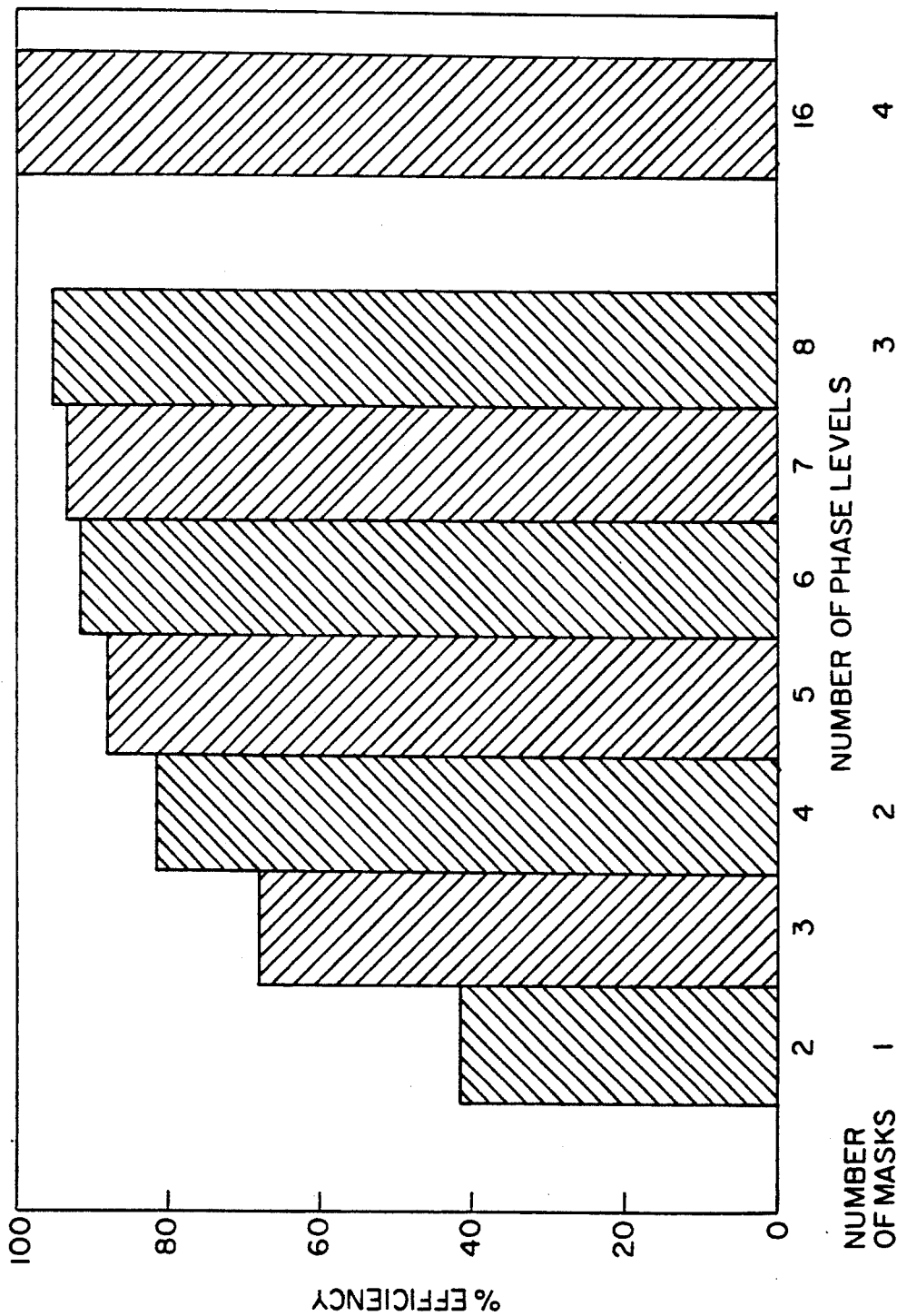
FIG. 2 is a graph of first order diffraction efficiency in a multilevel zone plate as a function of the number of phase levels and fabrication masks.

FIG. 1a shows an example of a Fresnel zone plate having a continuous phase profile capable of achieving 100% efficiency. The $2\pi$ phase depth corresponds to a material depth of about one micrometer for visible light. Because the technology to produce the continuous phase profile of FIG. 1a does not exist, an approximation to the continuous phase is desirable. FIGS. 1b and 1c show Fresnel phase zone plate profiles quantized to two and four phase levels, respectively. The two-level phase, profile of FIG. 1b results in a diffraction efficiency of 40.5%, and the four-level profile of FIG. 1c results in an efficiency of 81%. For obtain optical applications, such discrete phase structures need to achieve a diffraction efficiency of 95% or higher. FIG. 2 shows the diffraction efficiency as a function of the number of discrete phase levels. Eight phase levels achieve 95% efficiency.

The method of the invention accurately and reliably produces multilevel, on-axis, diffractive optical surfaces. Optical elements can be made for use at wavelengths ranging from the ultraviolet to the infrared. These multilevel structures are useful not only for monochromatic light, but also for systems operating with fractional bandwidths as large as 40%. The methods disclosed herein take advantage of technology developed for electronic circuit fabrication such as high resolution lithography, mask aligning, and reactive ion etching. The process for defining the phase profile to be constructed will now be discussed.

Collimated monochromatic light incident on a phase Fresnel zone plate (FIG. 1a) will be diffracted with the light being focused perfectly. The necessary phase profile can be expressed in the simple form $$|\phi(x,y)|_{2\pi} = \frac{2\pi}{\lambda} \sqrt{x^2 + y^2 + F^2} \tag{1}$$

where $\lambda$ is the wavelength, F the focal length, and $\phi$ is evaluated modulo $2\pi$. The phase Fresnel zone plate is an interesting yet limited example of a profile. In general, it is desirable to define arbitrary diffractive phase profiles.

There exist numerous commercially available lens design programs. Many of these programs allow one to describe a general diffractive phase profile on a given surface. The phase profile is described by making an analogy to the optical recording of holographic optical elements. The wavelength and location in space of two coherent point sources are defined and the resulting interference pattern describes the diffractive phase profile. This process describes more general profiles than a simple zone plate, however, which is still a small subset of the possible profiles. In order to make the phase profiles span a much larger set of possibilities, an additional phase term $$\phi(x,y) = \frac{2\pi}{\lambda} \sum_{n,m} a_{nm} x^n y^m \tag{2}$$

can be added onto the phase determined from the two point sources. For on-axis phase profiles, the two point sources must lie on the optical axis. Furthermore, if the locations of the two point sources are both set to infinity, then the effect of their interference is null and the phase profile is completely described by the general polynomial expansion of equation (2). One of these general diffractive phase profiles can therefore be placed on any surface of an optical system.

Lens design programs have optimization routines that treat the curvatures of surfaces, the thickness of elements, and the element spacings as variables. Likewise, if a diffractive phase profile is in the system, the optimization routine can treat the polynomial coefficients, $a_{nm}$, as variables. A lens optimization program will determine the optimum coefficients, $a_{nm}$, of the diffractive phase profile for any particular lens systems.

The diffractive phase profile determined by the lens design program and defined by equation (2) contains no information on, how to achieve high diffraction efficiency. Our approach is to take the optimized $a_{nm}$'s and from them define a set of binary amplitude masks. The algorithm for designing these masks is shown in Table 1.

The equation $\phi(x,y) = C$, where C is a constant, describes an equiphase contour. Mask 1 describes the set of equiphase contours that are integer multiple of $\pi$. Mask ($n = 2, 3 \ldots$) describes the set of equiphase contours that are integer multiples of $\pi/2(n-1)$.

The area between the first two sequential equiphase boundaries is lithographically exposed. The areas between subsequent sequential equiphase boundaries alternate from not being exposed to being exposed. This process is repeated until the total pattern is drawn, covering the full optical aperture.

Table 1 also indicates the phase depth $\theta$ to which various lithographic mask patterns are etched. The relationship between phase depth and materials depth d is simply $$d = \frac{\lambda \theta}{2\pi(n-1)}$$

where n is the refractive index of the optical material. Column 4 of Table 1 indicates the relationship between the number of phase levels $k = 2^N$ and the number of masks N.

Column 5 indicates the achievable diffraction efficiency $\eta$. It is remarkable and an important point of this disclosure that with a mere four masks, 99% diffraction efficiency can be achieved. These binary amplitude masks will then be used in the actual construction of a highly efficient diffractive phase profile.

TABLE 1

Multimask Design Algorithm $$\phi(x,y) = \frac{2\pi}{\lambda} \sum_{n,m} a_{nm} x^n y^m$$

| Mask # N | Equi-phase Boundaries (l = 0, ±1, ±2, ...) | Phase Etch Depth $\theta$ | # Phase Levels $\kappa$ | % eff · $\eta$ |
|---|---|---|---|---|
| 1 | $\phi(x,y) = (l + 1)\pi$ | $\pi$ | 2 | 40.5 |
| 2 | $\phi(x,y) = \frac{(l + 1)\pi}{2}$ | $\pi/2$ | 4 | 81.0 |
| 3 | $\phi(x,y) = \frac{(l + 1)\pi}{4}$ | $\pi/4$ | 8 | 95.0 |
| 4 | $\phi(x,y) = \frac{(l + 1)\pi}{8}$ | $\pi/8$ | 16 | 99.0 |

Three tools necessary for practicing the method of the present invention have been developed over the past ten years by the semiconductor industry. They include sub-micron lithography, ion etchers, and mask aligners. Lithographic pattern generators are capable of drawing binary amplitude masks with feature sizes of 0.1 $\mu$m and positioning the features to an even greater accuracy. Reactive ion etchers can etch a binary profile to depths of a few microns with an accuracy on the order of tens of angstroms. Mask aligners are used routinely to align two patterns with an accuracy of fractions of a micron. These are the key technological advances that make it possible to produce high quality diffractive phase profiles.

Electron beam pattern generators produce masks that have binary transmittance profiles. A thin layer of chromium on an optically flat quartz substrate is patterned by e-beam lithography. The input to the e-beam pattern generator is a file stored on a computer tape and properly formatted for the particular machine. For multilevel diffractive elements, the algorithm described in Table 1 defines the patterns to be drawn. The number of phase levels in the final diffractive element constructed from these masks is $2^N$, where N is the number of masks. For example, only four masks will produce 16 phase level resulting in an efficiency of 99%.

Figure 3:
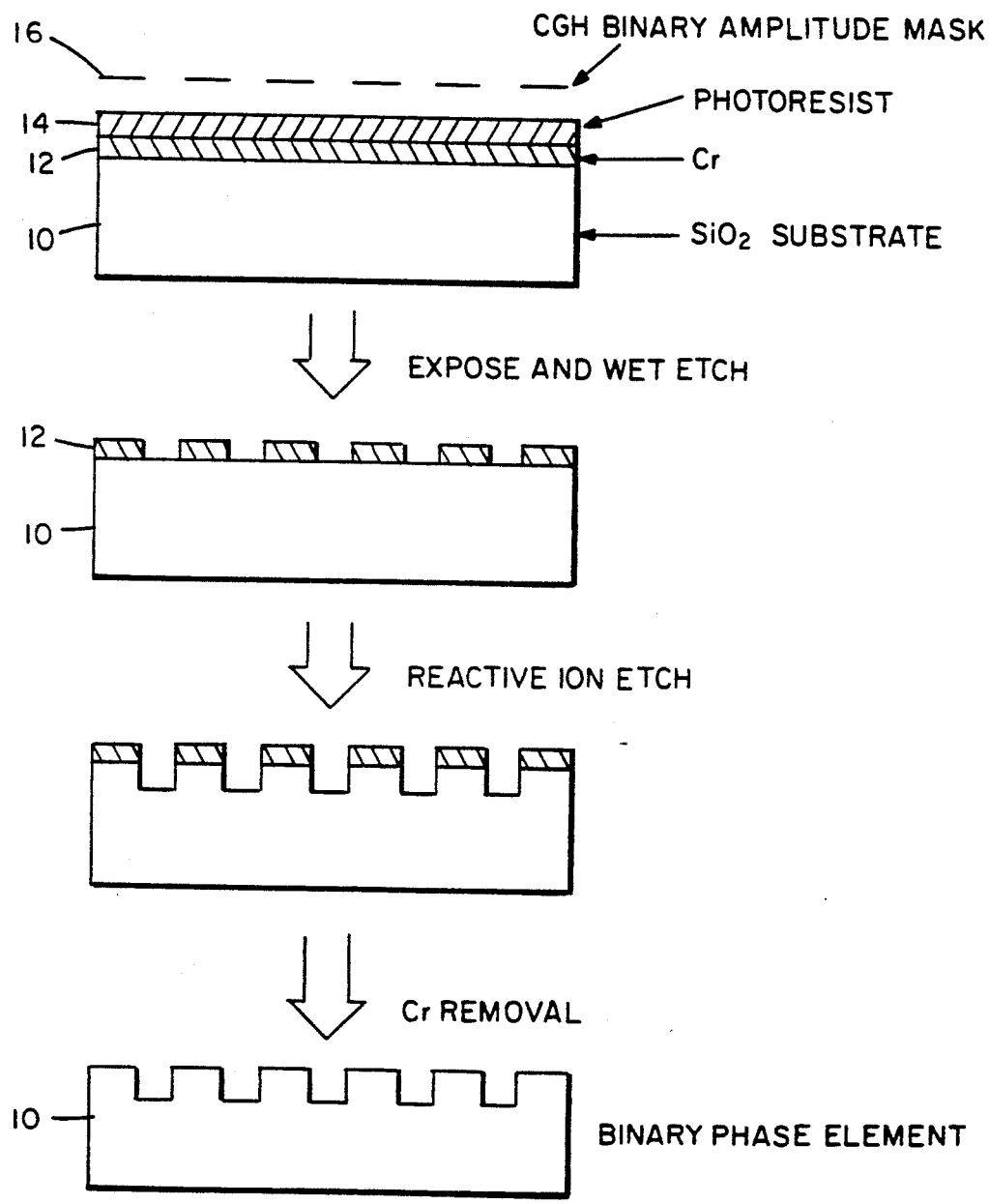
FIG. 3 is a schematic representation of a binary element fabrication technique disclosed herein.

The binary amplitude masks produced from the pattern generator are then used in a serial fashion to construct the multilevel optical element. The fabrication process using the first mask is shown in FIG. 3. An optical substrate 10 such as $SiO_2$ on which the diffractive profile is to reside is coated with a layer of chromium 12 and a layer of photoresist 14. An e-beam generated mask 16 is then placed over the substrate 10 and illuminated with a standard uv photoresist exposure system (not shown). The photoresist layer 14 is then developed resulting in a properly patterned layer of photoresist. The photoresist acts as an etch stop for the reactive ion etching.

Reactive ion etching (RIE) is a process in which an RF electric field excites a gas to produce ions. The ions react with the material of the substrate and etch away the surface at a controlled rate. The reactive ion etching process is anisotropic so that the vertical side walls of the discrete phase profile are retained. Typical RIE etch rates are on the order of 100 Angstroms to 200 Angstroms per minute. As an example, the required first level etch depth for a quartz substrate to be used at a wavelength of 6328 Angstroms is 7030 Angstroms. The necessary etch time is on the order of one-half hour and numerous elements can be etched simultaneously. After the pattern of the first mask has been etched into the substrate, any residual photoresist and chromium are stripped away.

The same procedure outlined above is then repeated on the optical substrate 10, only this time using a second mask and etching to one half the depth of the first etch. For the second and subsequent masks an additional complication arises. These masks have to be accurately aligned to the already existing pattern produced from an earlier etch. Fortunately, the problem of accurately aligning patterns has been solved by the integrated circuit industry. Commercially available mask aligners are capable of aligning two patterns to a fraction of a micron. This accuracy is sufficient to retain diffraction limited performance for the majority of the multilevel structures designed to operate in the visible and infrared.

Figure 4:
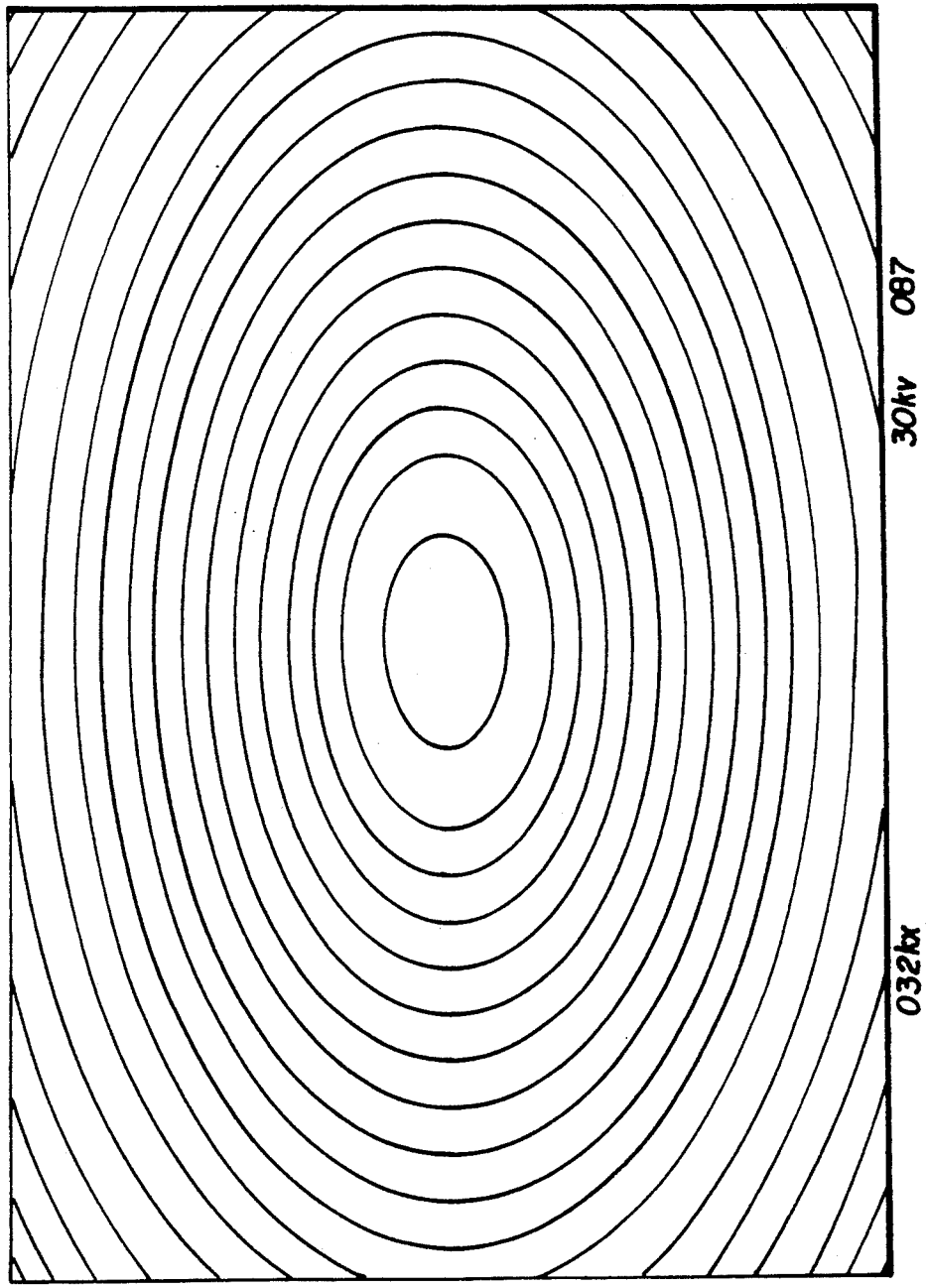
FIG. 4 is a scanning electron microscope photomicrograph of an eight-level Fresnel zone plate made in accordance with the present invention.

The simplest example of a diffractive optical element is the Fresnel zone plate described by equation (1). The applicants herein have carried out the above procedure and produced, With three masks, an eight level Fresnel zone plate. FIG. 4 is an SEM photograph of the element. The element was designed for use wth a HeNe laser of wavelength 6328 Angstroms and is a quartz substrate with a diameter of two inches. The experimentally measured diffraction efficiency of the element was 92%. Other multilevel phase Fresnel zone plates have been made for use with GaAs laser diodes.

In addition to Fresnel zone plates, the methods of the invention are utilized in making refractive/diffractive combination optical elements. Fresnel zone plates are, in practice, useful for collimating a monochromatic point source of light. An aspheric conventional lens, can perform the same function at considerably higher cost. A spherical lens is significantly less expensive yet cannot achieve perfect collimation. It is, however, possible to take a spherical lens and calcuate from a lens design program the necessary diffractive profile that when etched into a surface of the spherical lens will result in perfect collimation.

Figure 5B:
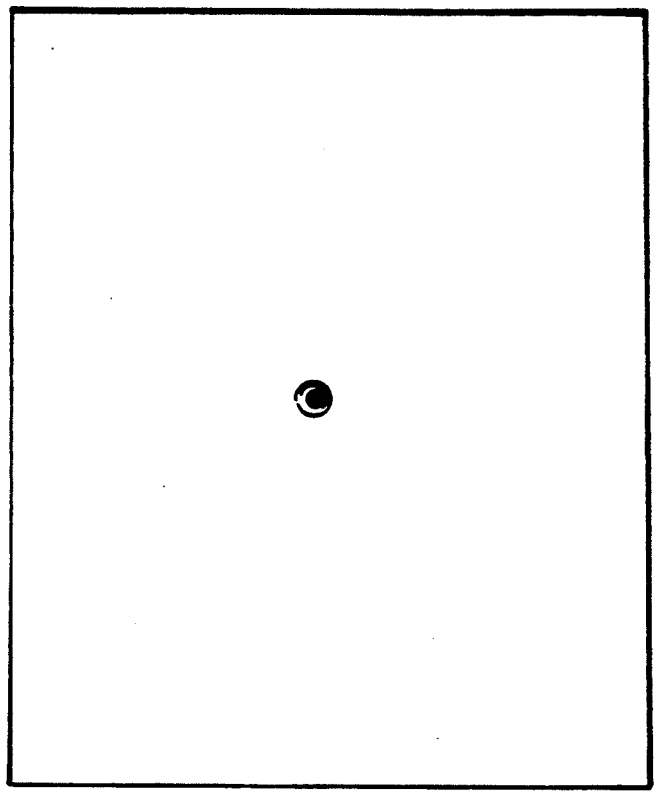
FIGS. 5a and 5b are diffraction patterns showing spherical aberration in an uncorrected and corrected quartz lens, respectively.
Figure 5A:
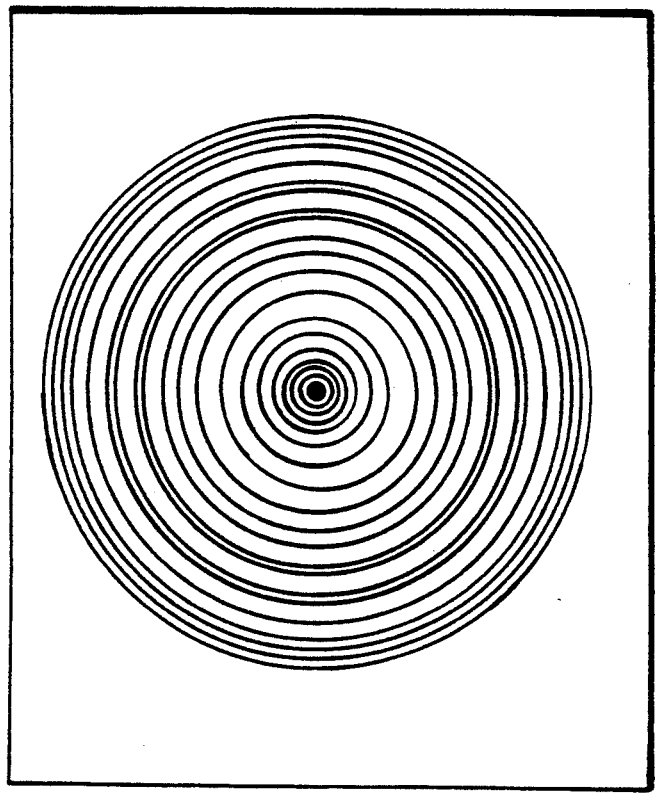

FIGS. 5a and 5b illustrate aberration correction utilizing the optical elements according to the present invention. FIG. 5a shows an uncorrected spherical aberration pattern produced by a quartz lens when tested with a HeNe laser at 6328 Angstroms. Note that FIG. 5a shows a 150 micron wide point spread function exhibiting classical spherical aberration. FIG. 5b shows the results when the lens includes an eight-phase-level pattern etched into the back surface of a plano-spherically convex quartz lens. The eight-phase-level pattern made using three masks in effect turns a spherical lens into a near-diffraction-limited asphere. Note that the power of the six micron focal point shown in FIG. 5b is increased nearly two hundred-fold over a similar spot in FIG. 5a. Such an optical element will have both refractive and diffractive properties.

The disclosed technique can not only correct for spherical aberrations in imperfect optics but for chromatic aberrations as well. All optical materials are dispersive. Dispersion is an undesirable property that must be avoided in broadband optical systems. Generally this is done by balancing the dispersive property of two different optical materials. An achromatic lens is therefore usually a doublet or a triplet lens. This approach leads to expensive and bulky optics. With efficient diffractive optics as disclosed in this patent application chromatic balancing with multiple elements can be avoided altogether. The diffractive focal power of a combined diffractive refractive lens can be used to balance the chromatic dispersion of the conventional lens provided the ratio of the diffractive to refractive focal lengths at the center wavelength is $$\frac{F_{diff}}{F_{conv}} = \frac{(n_c - 1)}{\lambda_c d} \quad (3)$$

In Equation 3, $n_c$ is the index of refraction of the conventional material at the center wavelength, $\lambda_c$, and d is the dispersion constant of the material, i.e., the slope of the index of refraction vs. wavelength curve.

Figure 6:
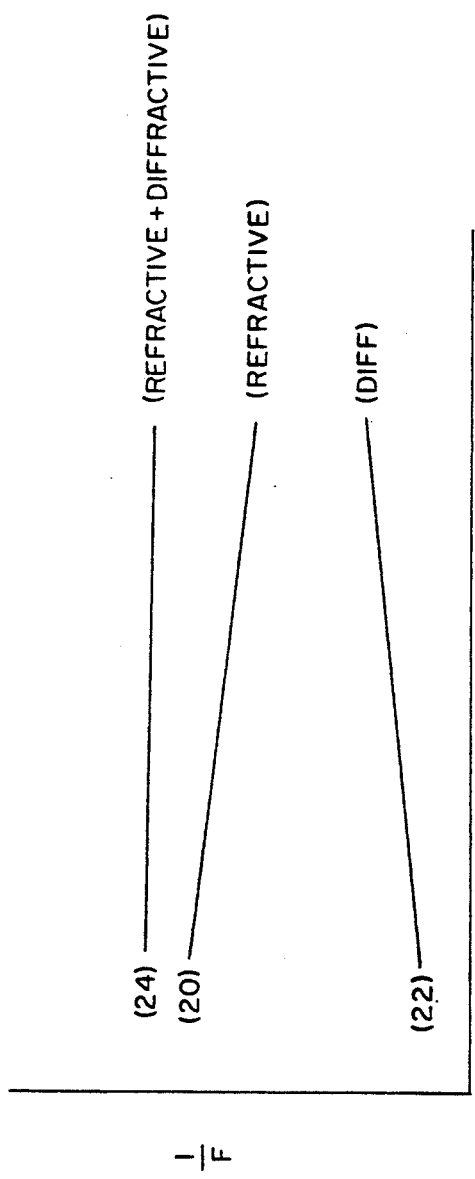
FIG. 6 is a graph showing diffractive and refractive dispersion.

FIG. 6 shows this concept, The compensating dispersion is linearly proportional to the focal length of the diffractive component. Curve 20 represents the dispersion due to the bulk dielectric of the conventional lens and curve 22 to the dispersion of the diffractive component. The horizontal axis represents the wavelength bandwidth over which the compensation occurs and the vertical axis represents the optical power (1/F). Adding the optical powers of the refractive and diffractive components together results in curve 24. By satisfying Equation 3, the optical power (and therefore focal length) can be made constant over the wavelength band.

Balancing of the chromatic aberration can occur over a very large bandwidth. Its width clearly depends on the used wavelength, the system's application, and on the linearity of the chromaticity of the refractive lens component.

Figure 7C:
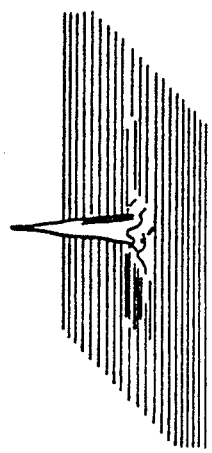
FIGS. 7a, b and c are point spread function plots showing diffractive correction of silicon lenses.
Figure 7B:
Figure 7A:
Figure 8:
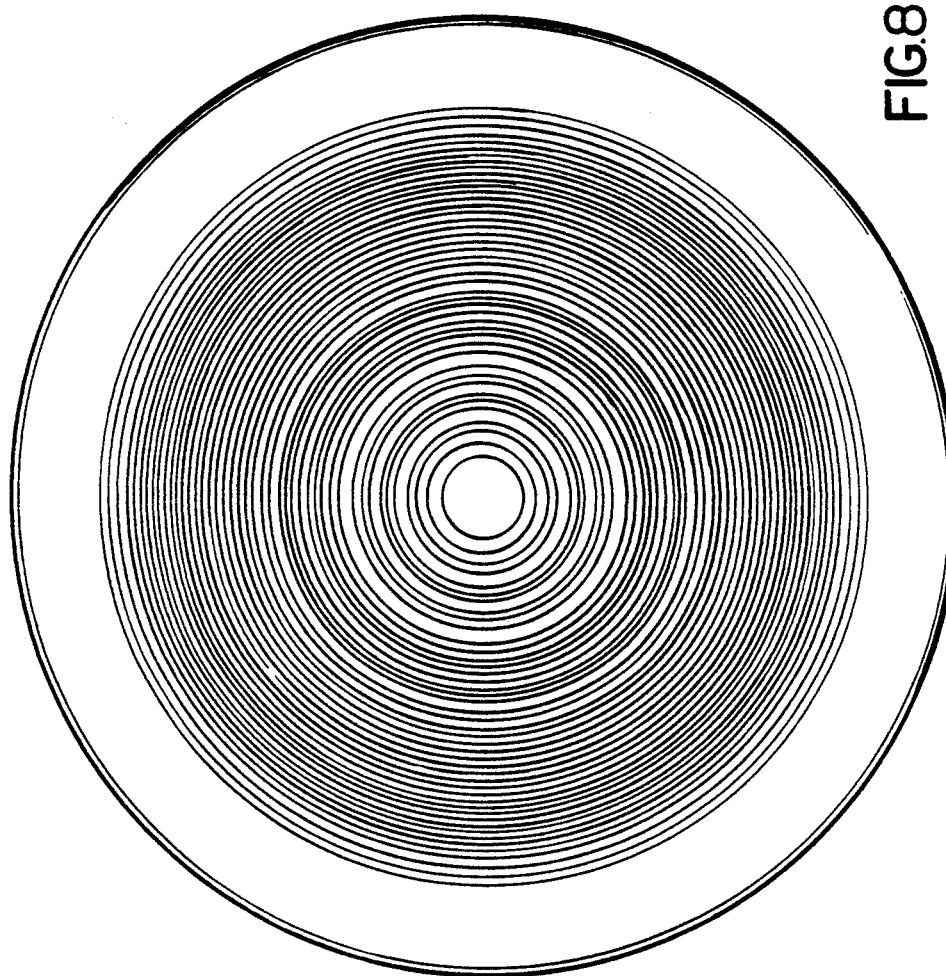
FIG. 8 is a photograph of the diffractively corrected silicon lens.
Figure 8:
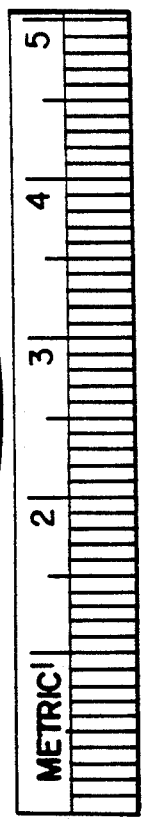

FIGS. 7a, b and c show a design comparison of an F/2 silicon lens in the 3-5 micron waveband. FIG. 7a shows the points spread function of a conventional spherical lens. FIG. 7b shows the point spread function of a conventional aspheric lens and FIG. 7c shows the diffraction limited operation when both spherical and chromatic aberration corrections are etched into the surface of a simple spherical lens. FIG. 8 shows a corrected silicon lens made by the multilevel process.

A particularly useful embodiment of the present invention is in semiconductor UV lithographic systems where a lack of good transmissive materials (UV grade silica is one of a few) makes conventional broadband chromatic correction nearly impossible. Even microlithography systems based on KrF eximer lasers are severly limited by the lack of suitable UV transmitting achromatic materials. At or below 2500 Angstroms, even fused silica is so dispersive that a few Angstroms bandwidth imposes intolerable chromatic and spherical aberrations. The multilevel structures of the present invention will improve dramatically the capabilities of equipment such as contact printers, projection and proximity wafer printers, step-and-repeaters, microscopes, mask pattern generators, and mask aligners, all of which are based on UV mercury lamp or UV eximer laser optics. The binary corrective patterns for UV lithographic lenses have periodicities and feature sizes that are far larger than the UV wavelength used. A typical projection printer lens may have minimum features in the needed binary pattern of 2-5 microns. Thus, it is feasible to fabricate UV binary lenses, taking into consideration materials and pattern resolution constraints.

A shift from $\lambda = 3500$ Angstroms to $\lambda = 1900$ Angstroms can double circuit density. Present efforts with KrF eximer laser technology are limited to $10^{-4}$ fractional bandwidths. With binary optics chromatic corrections the limits can be extended to $10^{-2}$. Therefore, the throughput can increase by a factor of 100 with additional benefits of reduced sensitivity to image speckle and dust. Another less obvious benefit of the reduced wavelength is a doubling of depth of focus. This doubling relaxes mechanical alignment tolerances in proximity printers and extends mask lifetimes.

With the technique described in this disclosure a
1) one hundred-fold increase in throughput of lithographically patterned circuitry may be possible;
2) shift into deep UV may increase circuit density by a factor of two; and
3) shift to deep UV will also relax proximity restraints in submicron circuit designs by increasing the depth of focus by as much as 75%. *Semiconductor International*, May 1987, page 49

All this is possible because of fundamental dielectric materials constraints in purely refractive optical systems are eliminated or relaxed by the diffractive techniques described in this disclosure. The techniques according to the invention can thus be used for etching diffractive profiles into a lens surface to effect chromatic and spherical aberration correction for UV lithographic systems.

Figure 9:
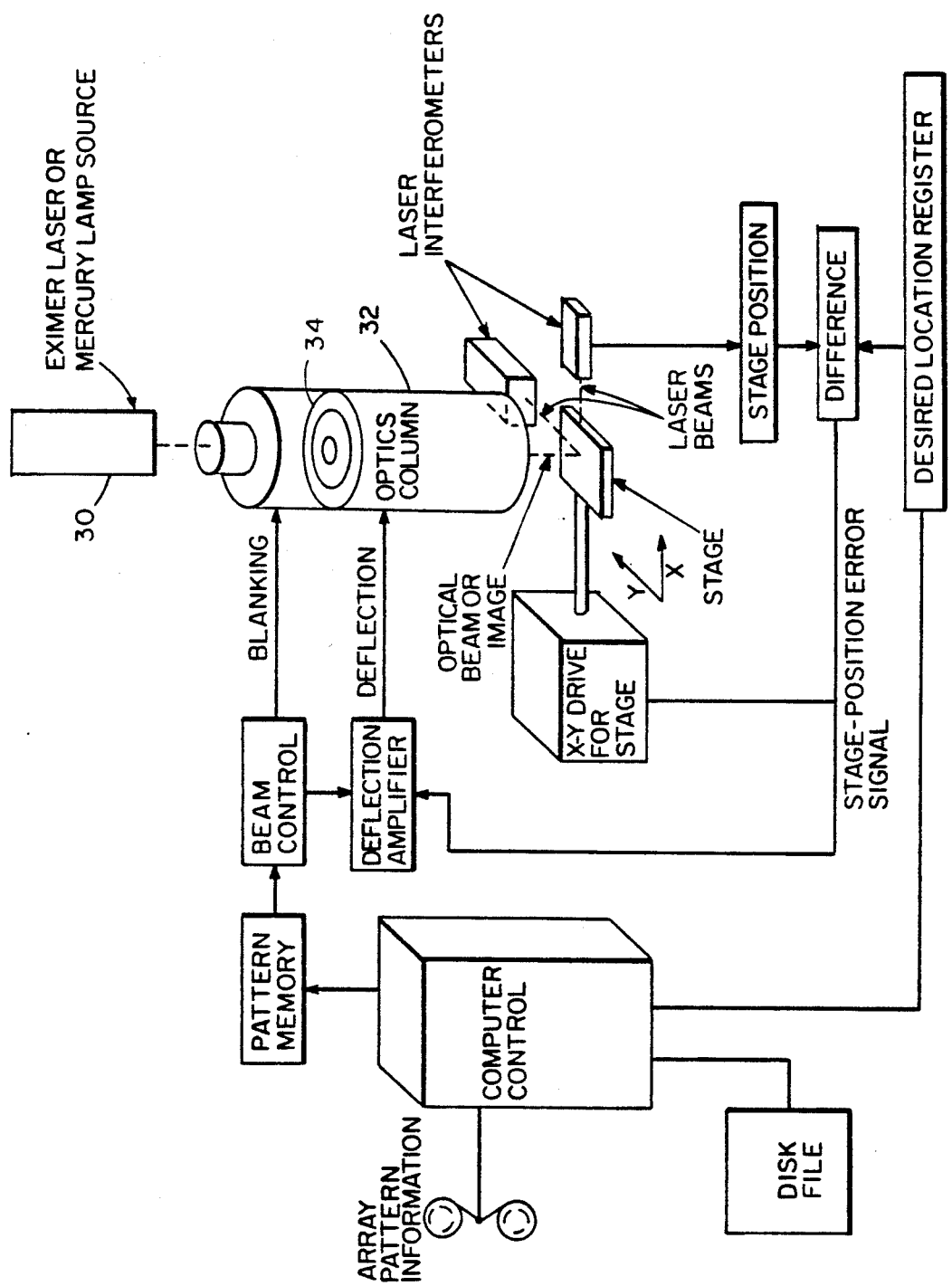
FIG. 9 is a schematic illustration of a UV lithographic exposure system utilizing the multilevel structures of the invention.

FIG. 9 shows a lithographic exposure system to reach deep UV for resolving 0.25 micron features. An eximer laser or mercury lamp source 30 illuminates a binary optics column 32 including on the order of 5 or 6 optical elements having the multilevel structures of the invention. The binary optics column 32 replaces conventional optics columns known in prior art lithographic exposure systems. Such conventional columns include many more optical elements than the column 32.

It should be noted that, as in circuit fabrication process, one set of masks can be used repeatedly to produce a large number of diffractive optical elements. Also, these diffractive surface profiles can be copied in metal using electroplating techniques. The metal master can then be used to emboss in plastic a large number of replicated optical components. The metal mastering and embossing replication is an established art.

What is claimed is:

1. Method for making high-efficiency, multilevel, diffractive optical elements comprising:
   generating at least one binary amplitude mask including multilevel information, the mask being configured to provide $2^N$ levels where N is the number of masks; and
   utilizing the masks' information for constructing $2^N$ levels in the optical element, the depths of the levels being related by a fixed ratio.

2. The method of claim 1 wherein the masks are made by lithographic pattern generators.

3. The method of claim 1 including three masks and eight levels.

4. The method of claim 1 wherein the binary amplitude masks are defined by calculating equiphase boundaries utilizing the equation $$\phi(x,y) = \frac{2\pi}{\lambda} \sum_{n,m} a_{nm} x^n y^m$$

and the algorithm

| Mask # N | Equi-phase Boundaries ($l = 0, \pm 1, \pm 2, \ldots$) | Phase Etch Depth $\theta$ |
|---|---|---|
| 1 | $\phi(x,y) = (l + 1)\pi$ | $\pi$ |
| 2 | $\phi(x,y) = \frac{(l + 1)\pi}{2}$ | $\pi/2$ |
| 3 | $\phi(x,y) = \frac{(l + 1)\pi}{4}$ | $\pi/4$ |
| 4 | $\phi(x,y) = \frac{(l + 1)\pi}{8}$ | $\pi/8$ |

5. The method of claim 1 wherein the masks are made by electron beam pattern generators.

6. The method of claim 1 wherein the optical element is a lens.

7. The method of claim 1 wherein the optical element corrects for spherical aberration.

8. The method of claim 1 wherein the optical element is corrected for chromatic aberration.

9. Method for making high-efficiency multilevel diffractive optical elements comprising:
   making a master optical element according to the method of claim 1; and
   using the master optical element to emboss multiple replicated optical components.

10. The method of claim 9 wherein the master optical element is copied in metal which is used for the embossing.

11. Method for making a high efficiency, multi-level, diffractive optical element comprising:
    providing a substrate including at least two initial levels;
    generating at least one binary amplitude mask including multi-level information; and
    utilizing the mask to double the number of levels in the element.

* * * * *

UNITED STATES PATENT AND TRADEMARK OFFICE
CERTIFICATE OF CORRECTION

PATENT NO. : 5,218,471
DATED : June 8, 1993
INVENTOR(S) : Gary J. Swanson and Wilfrid B. Veldkamp It is certified that error appears in the above-indentified patent and that said Letters Patent is hereby corrected as shown below:

Column 1, line 46: delete "diffusion" and insert therefor -- diffraction --;

Column 2, line 63: delete "obtain" and insert therefor -- certain --;

Column 4, line 35: delete "(l = 0, ±1, ±2, ...)" and insert therefor -- ($\ell$ = 0, ±1, ±2, ...) --;

Column 4, line 36: delete "(1 + 1)" and insert therefor -- ($\ell$ + 1) --;

Column 4, line 38: delete "(1 + 1)" and insert therefor -- ($\ell$ + 1) --;

Column 4, line 40: delete "(1 + 1)" and insert therefor -- ($\ell$ + 1) --;

Column 4, line 42: delete "(1 + 1)" and insert therefor -- ($\ell$ + 1) --;

Column 8, line 30: delete "(l = 0, ±1, ±2, ...)" and insert therefor -- ($\ell$ = 0, ±1, ±2, ...) --;

UNITED STATES PATENT AND TRADEMARK OFFICE
CERTIFICATE OF CORRECTION

PATENT NO. : 5,218,471

DATED : June 8, 1993

INVENTOR(S) : Gary J. Swanson and Wilfrid B. Veldkamp

It is certified that error appears in the above-indentified patent and that said Letters Patent is hereby corrected as shown below:

Column 8, line 31: delete "(1 + 1)" and insert therefor -- $(\ell + 1)$ --;

Column 8, line 33: delete "(1 + 1)" and insert therefor -- $(\ell + 1)$ --;

Column 8, line 35: delete "(1 + 1)" and insert therefor -- $(\ell + 1)$ --; and

Column 8, line 37: delete "(1 + 1)" and insert therefor -- $(\ell + 1)$ --.

Signed and Sealed this

Tenth Day of May, 1994

Attest:

BRUCE LEHMAN

*Attesting Officer*   *Commissioner of Patents and Trademarks*